US00RE41801E

(19) United States
(12) Reissued Patent
Venkatasubramanian

(10) Patent Number: US RE41,801 E
(45) Date of Reissued Patent: Oct. 5, 2010

(54) THIN-FILM THERMOELECTRIC DEVICE AND FABRICATION METHOD OF SAME

(75) Inventor: Rama Venkatasubramanian, Cary, NC (US)

(73) Assignee: Nextreme Thermal Solutions, Inc., Durham, NC (US)

(21) Appl. No.: 10/404,144

(22) PCT Filed: Mar. 31, 1998

(86) PCT No.: PCT/US98/06150

§ 371 (c)(1),
(2), (4) Date: Nov. 3, 1999

(87) PCT Pub. No.: WO98/44562

PCT Pub. Date: Oct. 8, 1998

Related U.S. Patent Documents

Reissue of:
(64) Patent No.: 6,300,150
Issued: Oct. 9, 2001
Appl. No.: 09/381,963
Filed: Nov. 3, 1999

U.S. Applications:
(60) Provisional application No. 60/042,845, filed on Mar. 31, 1997.

(51) Int. Cl.
*H01L 21/44* (2006.01)

(52) U.S. Cl. ..... 438/3; 438/27; 438/666; 438/29; 438/54; 257/E29.071; 257/E29.103; 257/E23.067; 257/E23.081; 257/E23.082; 257/930; 257/84; 257/94; 257/470

(58) Field of Classification Search ..... 438/27, 438/666, 3, 29, 84, 87, 94, 96, 467, 470, 438/930, 717; 257/668, 684, 700, 712, 717, 257/930 E, 29.071, 103, E23.067, E23.081, 257/E23.082, E25.011, 84, 94, 96, 467, 470, 257/930

See application file for complete search history.

(56) References Cited

U.S. PATENT DOCUMENTS 3,076,051 A 1/1963 Haba
3,261,079 A 7/1966 Clingman, Jr. et al.
3,379,577 A 4/1968 Bird, Jr.

(Continued)

FOREIGN PATENT DOCUMENTS

EP 0447 020 9/1991

OTHER PUBLICATIONS

Integrated Thin Film –++Thermoelectric Cooler, Gao Min et al., Electronics Lettters, Jan. 22, 1998, vol. 34, No. 2, pp. 222–223.

(Continued)

*Primary Examiner*—Michael S Lebentritt
(74) *Attorney, Agent, or Firm*—Myers Bigel Sibley & Sajovec, P.A.

(57) ABSTRACT

A [termoelectric] *thermoelectric* device and method for manufacturing the thermoelectric device. The [thermoelectric] *thermoelectric* device includes at least one deposited film of a thermoelectric material having opposed first and second major surfaces separated by a thickness of the at least one deposited film with the at least one deposited film being patterned to define a plurality of thermoelements arranged in a matrix pattern having rows of alternating conductivity type, a first header having formed thereon a first interconnecting member with the first header mounted on the first major surface of the deposited film such that the first interconnecting member is connected to one side of the plurality of thermoelements and connects adjacent thermoelements of an opposite conductivity type, and a second header having formed thereon a second interconnecting member with the second heads mounted on the second major surface of the deposited film such that the second interconnecting member is connected to an opposite side of said plurality of thermoelements and connects adjacent thermoelements of an opposite conductivity type.

56 Claims, 5 Drawing Sheets

U.S. PATENT DOCUMENTS

| | | | |
|---|---|---|---|
| 3,781,176 | A | 12/1973 | Penn et al. |
| 3,930,303 | A | 1/1976 | Alais et al. |
| 4,054,478 | A | 10/1977 | Linnon |
| 4,081,895 | A | 4/1978 | Germano et al. |
| 4,149,025 | A | 4/1979 | Niculescu |
| RE30,652 | E | 6/1981 | Germano et al. |
| 4,343,960 | A | 8/1982 | Eguchi et al. |
| 4,444,991 | A | 4/1984 | Beale |
| 4,493,939 | A | 1/1985 | Blaske et al. |
| 4,902,648 | A | 2/1990 | Ohta et al. |
| 4,971,632 | A | 11/1990 | Rowe |
| 4,983,225 | A | 1/1991 | Rowe |
| 5,006,505 | A | 4/1991 | Skertic |
| 5,286,304 | A | 2/1994 | Macris et al. |
| 5,411,599 | A | 5/1995 | Horn et al. |
| 5,415,699 | A | 5/1995 | Harman |
| 5,416,046 | A | 5/1995 | Wang |
| 5,436,467 | A | 7/1995 | Elsner et al. |
| 5,900,071 | A | 5/1999 | Harman |
| 5,952,728 | A | 9/1999 | Imanishi et al. |
| 5,956,569 | A | 9/1999 | Shiu et al. |
| 6,060,656 | A | 5/2000 | Dresselhaus et al. |
| 6,107,645 | A | 8/2000 | Hidaka |
| 6,365,821 | B1 | 4/2002 | Prasher |

OTHER PUBLICATIONS

Potential of Si–based Superlattice Thermoelectric Materials for Integration with Si Microelectronics, Rama Venkatasubramanian et al., Research Triange Institute, 1998 IEEE, p. 869.

In–Plane Thermoelectric Properties of Freestanding Si/Ge Superlattice Structures, Rama Venkatasubramanian et al., Research Triangle Institute, 17$^{th}$ International Conference on Thermoelectrics (1998), 1998 IEEE, pp. 191–197.

Experimental Evidence of High Power Factors and Low Thermal Conductivity in $Bi_2Te_3/Sb_2Te_3$ Superlattice Thin–Films, Rama Venkatasubramanian et al., Research Triangle Institute, 15$^{th}$ International Conference on Thermoelectrics (1996) IEEE, pp. 454–458.

Electronic and Mechanical Properties of Ge Films Grown on Glass Substrates, R,K. Ahrenkiel et al. National Renewable Energy Laboratory, Rama Venkatasubramanian, Research Triangle Institute, 26$^{th}$ PVSC; Sep. 30–Oct. 3, 1997; Anaheim, CA, pp. 527–529.

MOCVD Of $Bi_2Te_3$ $Sb_2Te_3$ and Their Superlattice Structures for Thin–Film Thermoelectric Applications, Rama Venkatasubramanian et al., Research Triangle Institute, Journal of Crystal Growth 170 (1997) 817–821.

A Silent Cool: Thermoelectrics May Offer New Ways To Refrigerate and Generate Power, Corinna Wu, Science Service, Inc., Science News, Sep. 6, 1997 v152 n10 p152(2), pp. 1–3.

Semiconductor Devices Physics and Technology, Integrated Devices, pp. 468–470, John Wiley & Sons, 1985.

Thin–Film Superlattice and Quantum–Well Structures—A New Approach to High–Performance Thermoelectric Materials, Rama Venkatasubramanian, Naval Research Reviews, Center for Superconductor Research, Research Triangle Institute, 1996, pp. 31–41.

THIN-FILM THERMOELECTRIC DEVICE AND FABRICATION METHOD OF SAME

Matter enclosed in heavy brackets [ ] appears in the original patent but forms no part of this reissue specification; matter printed in italics indicates the additions made by reissue.

This application claims benefit of Provisional Appln No. 60/042,845 filed Mar. 31, 1997. +gi

*This invention was made with Government support under Contracts N00014-94-C-0088 and/or N00014-97-C-0088 awarded by the Office of Naval Research and Contract N00014-97-C-0211 awarded by the Defense Advanced Research Projects Agency. The Government has certain rights in the invention.*

BACKGROUND OF THE INVENTION

1. Field of the Invention

The present invention relates to thin-film thermoelectric devices and methods of manufacturing such devices, and particularly to thin-film thermoelectric devices with high utilization efficiency and high cooling/packing density and methods of manufacturing such devices.

Thermoelectric thin films have been used to form high-performance thermoelectric devices. Superlattice thermoelectric materials and quantum-well and quantum-dot structured materials have been proposed. However, there exists a need to produce thin-film thermoelectric devices with a good thermoelement aspect-ratio for [em] *μm*-thick thin-films, and a need to easily interconnect these thermoelements. The thin-film thermoelectric devices should also be scalable to a variety of heat loads and manufacturable in large volume (area). The methods used to manufacture the devices must be amenable to automation, compatible with cascading or multi-staging (leading to a smaller ΔT per stage for a higher coefficient of performance in a refrigerator or for higher efficiency in a power generator) and is equally applicable to both cooling and power generation. Further, the device technology would enable the insertion of high-ZT thin-films (*i.e. films with a figure of merit ZT greater than one*) into high performance cooling devices while keeping the current levels compatible with present-day coolers and similar power generation devices.

SUMMARY OF THE INVENTION

An object of the present invention is to provide a thin-film thermoelectric device and a method of manufacturing the device that achieves high material utilization efficiency.

Another object of the present invention is to provide a thin-film thermoelectric device and a method of manufacturing the device that achieves high cooling/packing density.

A further object of the present invention is to provide a thin-film thermoelectric device and a method of manufacturing the device that is scalable to a variety of heat loads.

A still further object of the present invention to provide and manufacture large area thin-film thermoelectric devices.

Still another object is provide a thermoelectric elements that can be used with low-cost power supplies.

These and other objects are achieved by a thermoelectric device having a plurality of thermoelectric elements (i.e. a plurality of thermoelements) formed using thin films in the range of microns to tens of microns. The elements may be arranged in a matrix pattern with adjacent rows having opposite conductivity type. The elements are disposed on a header with a pattern of conductive members. Pairs of adjacent elements of opposite conductivity type are disposed on and connected by the conductive members. A second header with a second pattern of conductive members is disposed on top of the elements. The conductive members of the second header connect adjacent pairs of connected elements so that the pairs are connected in series.

These and other objects are also achieved by a method of forming a thermoelectric device. In one embodiment, thin films having a thickness on the order of microns to tens of ductivity type may be formed on different substrates or one film may be formed and later selectively doped to provide regions of opposite conductivity. The film or films are disposed on the first header and the substrates removed. When films of opposite conductivity type are used, they are arranged in an alternating manner. The films are patterned to provide a plurality of thermoelectric elements in a matrix pattern. Pairs of elements, one of each conductivity type are disposed on respective conductive members on the first header. A second header is disposed on the top of the elements. Conductive members on the second header contact the pairs such that the pairs are connected in series.

The device and method according to the invention are scalable to a variety of heat loads and is manufacturable in volume. They are amenable to automation and are compatible with cascading or multistaging. Further, the device and method are applicable to both cooling and power generation.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1B:
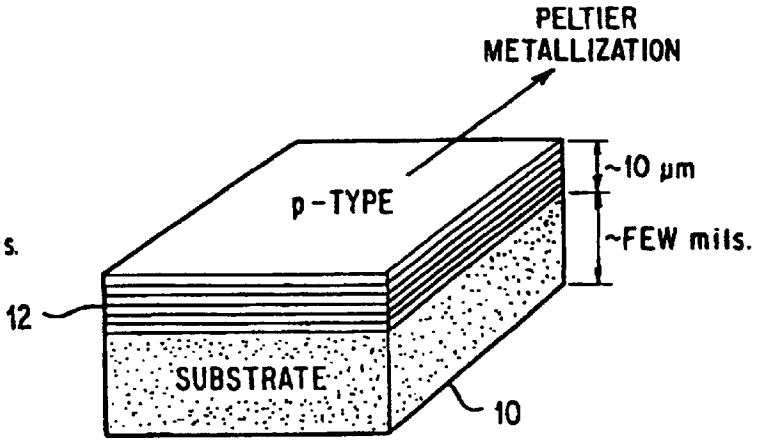
FIGS. 1A and 1B are diagrams of n and p type starting materials, respectively, illustrating a step of manufacturing according to the invention.

Referring to the drawings, wherein like reference numerals designate corresponding elements throughout the several view, and more particularly to FIG. 1 illustrating a step in the process of manufacturing a thin-film thermoelectric device according to the invention. The device according to the invention is called a Bipolarity-Assembled, Series Inter-Connected, Thin-Film Thermoelectric Device (BASIC-TFTD). It utilizes thin films of thickness in the range of microns to tens of microns, grown or deposited on a substrate using techniques such as metallorganic chemical vapor deposition (MOCVD), chemical vapor deposition (CVD), molecular beam epitaxy (MBE) and other epitaxial/non-epitaxile processes. The thin films can consist of thin-film superlattice or non-superlattice thermoelectric materials, quantum-well (two-dimensional quantum-confined) and quantum-dot (three dimensional quantum-confined type) structured materials, and non-quantum-confined materials. Also, materials that are peeled from bulk materials can also be used.

Figure 1A:
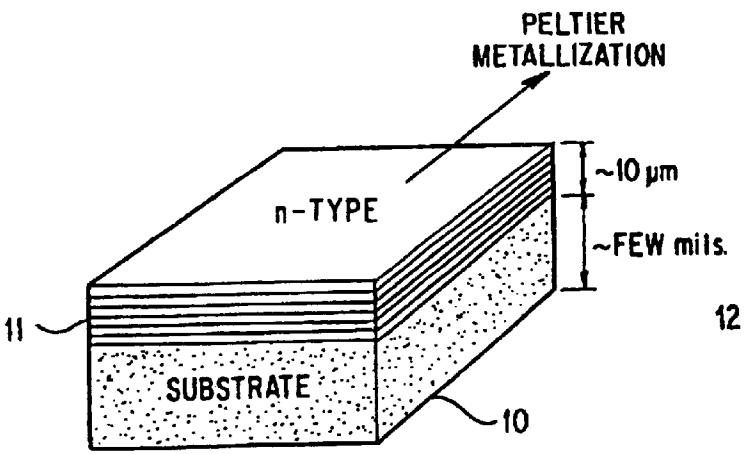

The method of manufacturing the device according to the invention is shown in the figure. In FIGS. 1A and 1B, n-type and p-type films 11 and 12 formed as described above are formed on substrates 10. Substrates 10 may have the same conductivity type as the overlying films 11 or 12. The films 11 and 12 are shown as multi-layered structures but could also be a single-layer structure. Typical dimensions of these wafers could be 2 cm×2 cm (width×length), but other sizes are possible. The substrates are typically a few mils thick and the film 11 and 12 are typically 5 to 20 μm in thickness. The films 11 and 12 are metallized, their respective upper surfaces providing a low-resistance contact, such as a low-resistance Peltier contact.

Figure 2B:
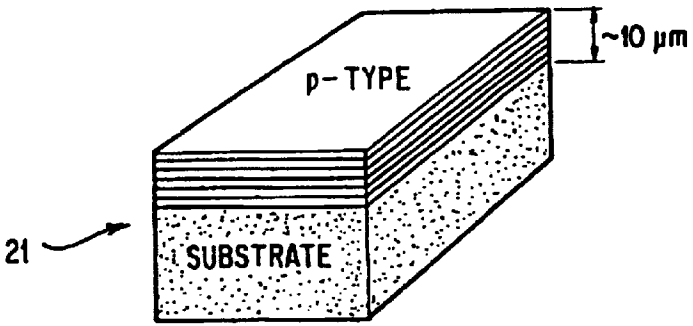
FIGS. 2A and 2B are diagrams of segments of the n and p type starting materials, respectively, illustrating a step of manufacturing according to the invention.
Figure 2A:
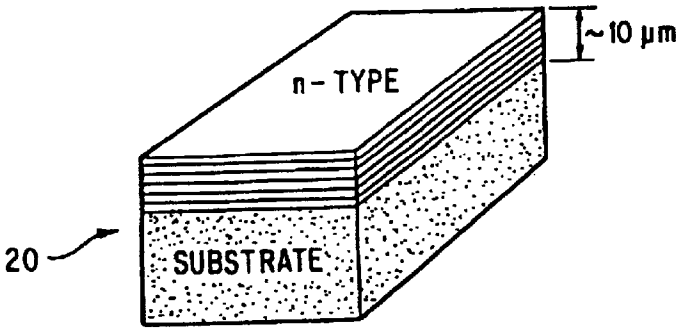

As shown in FIGS. 2A and 2B, the substrates 10 are separated by, for example, scribing, into many segments 20 and 21. A typical width of the segments 1 to 5 mm. The size of the substrates 10 before and after separation in segments can be varied depending upon the requirements of the resulting devices.

Figure 3:
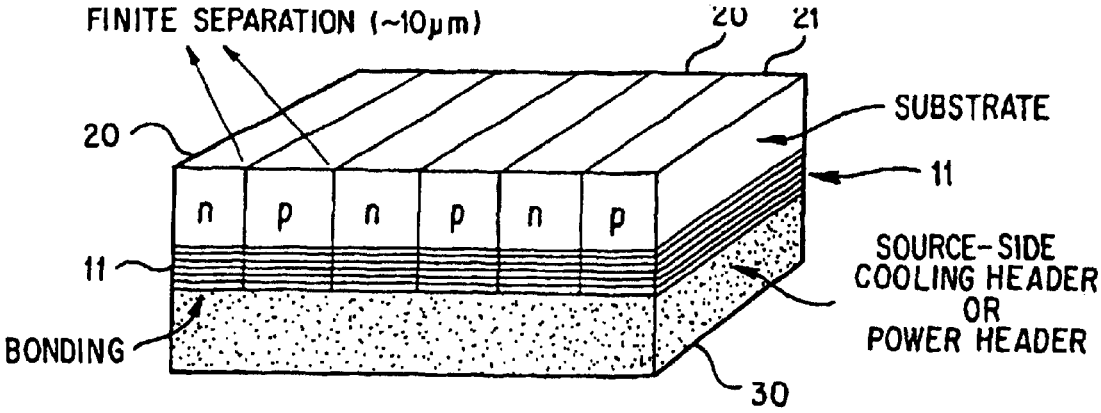
FIG. 3 is a diagram of assembled segments illustrating a step of manufacturing according to the invention.

The segments 20 and 21 are bonded onto a cooling header or a power header 30 with alternating conductivity in FIG. 3. The header can made of, for example, BeO. The bonding may be carried out using a conventional bonding method. Note that the substrates are facing upward and that the segments 20 and 21 have a finite separation, in this case of about 10 μm.

Figure 4:
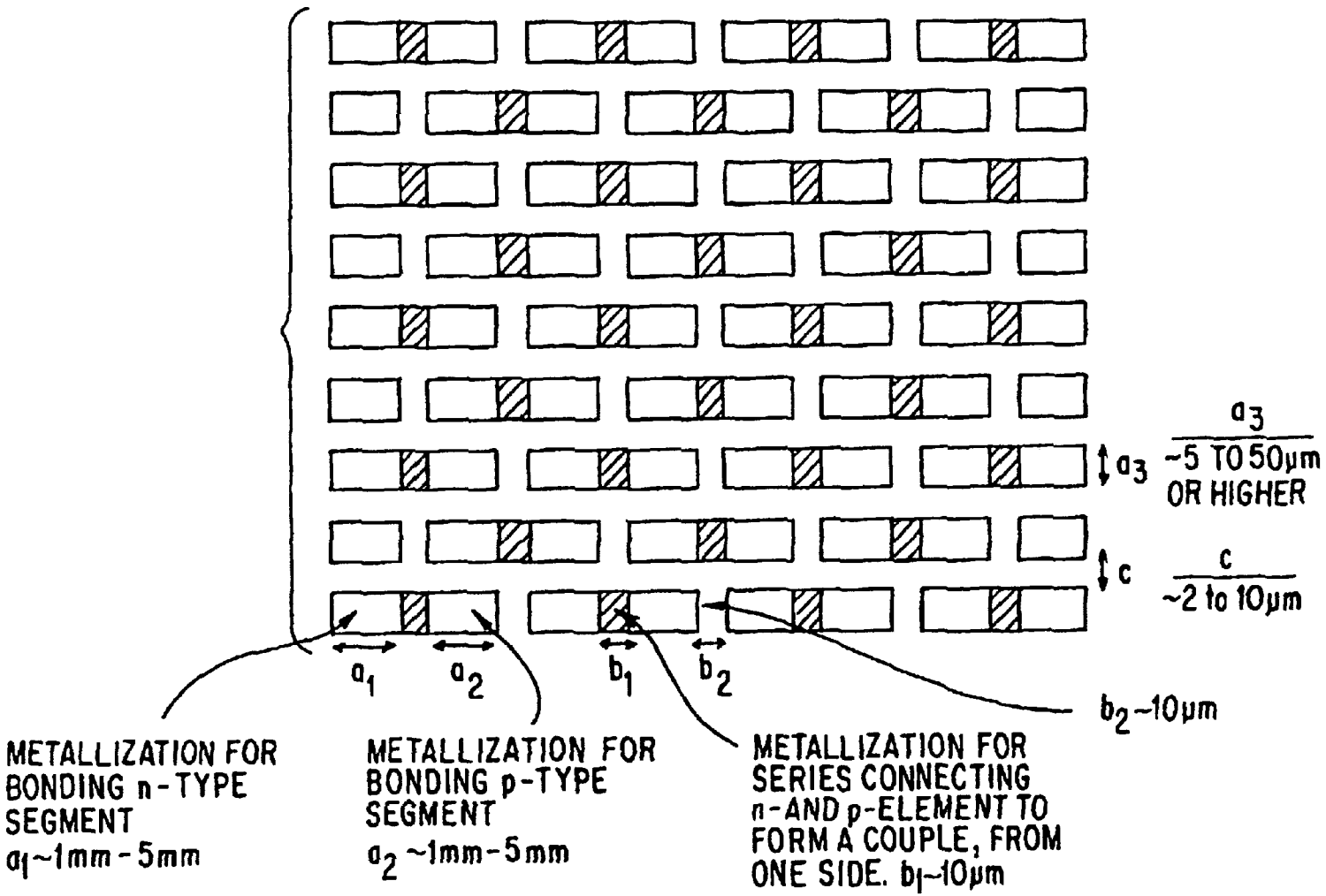
FIG. 4 is a plan view of a header for contacting the assembled segments.

The bonding pattern of the header 30, for an exemplary 8×9 thermoelement matrix, upon which the segments are bonded is shown in FIG. 4. The surfaces of the cooling header/power header 30 that come in contact with the n- and p-type segments have to be metallized prior to assembly to provide the necessary low-resistance electrical connection between adjacent n- and p-type segments. The header includes a metallization for bonding an n-type segment of size $a_1$, a metallization for bonding a p-type segment of size $a_2$, and a metallization for series-connecting n- and p-type segments to form a couple, The metallizations have a width $a_3$ and are separated in the in the length direction by a gap of size $b_2$ and in the width direction by a gap of size c. Typical dimensions for $a_1$, $a_2$, $b_1$, $b_2$ and c are given in FIG. 4.

FIG. 4 indicates ranges in dimensions $a_1$, $a_2$, $a_3$, $b_1$, $b_2$, and c with, according to the present invention, $a_1$ ranging from 1 mm to 5 mm, $a_2$ ranging from 1 mm to 5 mm, $a_3$ ranging from 5 to 50 μm, $b_1$ and $b_2$ approximately 10 μm, and c ranging from ~2 to 10 ~m.

Figure 5:
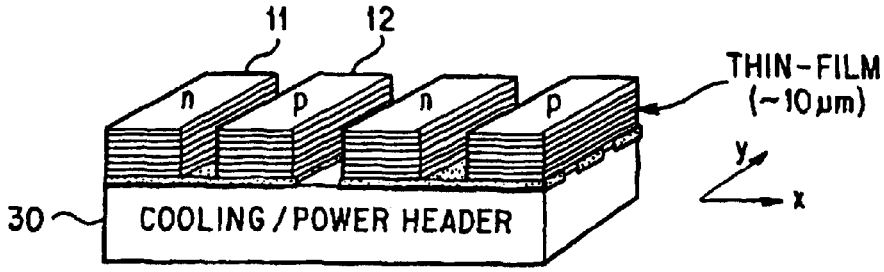
FIG. 5 is a diagram of n and p thin film sections disposed on the header of FIG. 3 illustrating a step of manufacturing according to the invention.

As shown in FIG. 5, the n- and p-type segments are attached to a mounting surface of the cooling/power header 30 (i.e. an interconnecting member between the n- and p-type segments) with the opposed major surfaces of the deposited film in each segment arranged parallel to the mounting surface of the cooling/power header 30.

Following the bonding of n- and p-type segments, the substrates from each of the p- and n-segments are removed selectively without affecting the films 11 and 12. This can typically be achieved by using selective etchants for substrates. Similar substrates, if used for both the n- and p-type segments 20 and 21, can be removed in a single substrate removal process. After this process the BASIC-TFTD device structure would look as shown in FIG. 5 where two pairs of n, p segments are shown for convenience. The segments 11 and 12, after substrate removal, are supported on the cooling/power header 30 for stability and handling.

As shown in FIG. 5, the overlying films 11 and 12 consisting of the afore-mentioned thin-film materials are arranged such the deposited films have opposed major surfaces separated by a total thickness of the deposited films such that at least one of the major surfaces is in contact with the cooling/power header 30.

Figure 6:
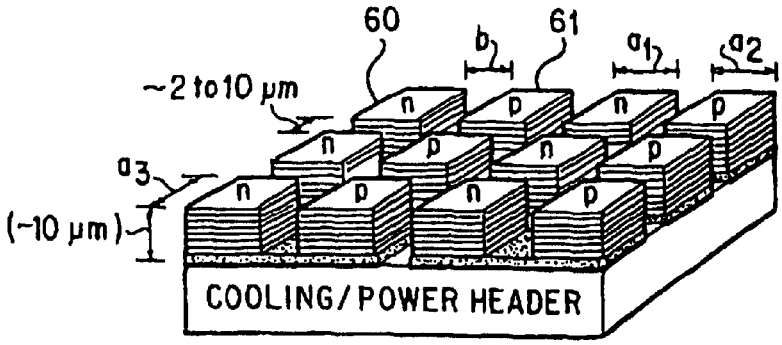
FIG. 6 is a diagram of a n and p sections disposed on the header of FIG. 3 after patterning, and illustrating a step of manufacturing according to the invention.

In the next processing step the segments 11 and 12 are patterned in the y-direction into sections 60 and 61. This step maybe carried out using photolithographic patterning followed by etching, or by laser ablation, for example. The device at this stage is shown in FIG. 6. Typical parameters of the sections, for two examples, are given as:

| | | |
|---|---|---|
| EXAMPLE 1 | $a_1$, $a_2$ ~1 mm<br>$a_3$ ~50 mm | Area = $a_1 \times a_3$ = 0.0005 $cm^2$ |
| EXAMPLE 2 | $a_1$, $a_2$ ~5 mm<br>$a_3$ ~100 mm | Area = $a_1 \times a_3$ = 0.005 $cm^2$ |

The dimensions indicated for $a_3$ and c can easily be achieved with conventional microelectronic processing/etching. Also, b, c<<$a_1$, $a_2$, and $a_3$. The invention also provides several advantages. The material removed in etching is very small, leading to good material utilization efficiency high cooling/packing density can be achieved.

Figure 7:
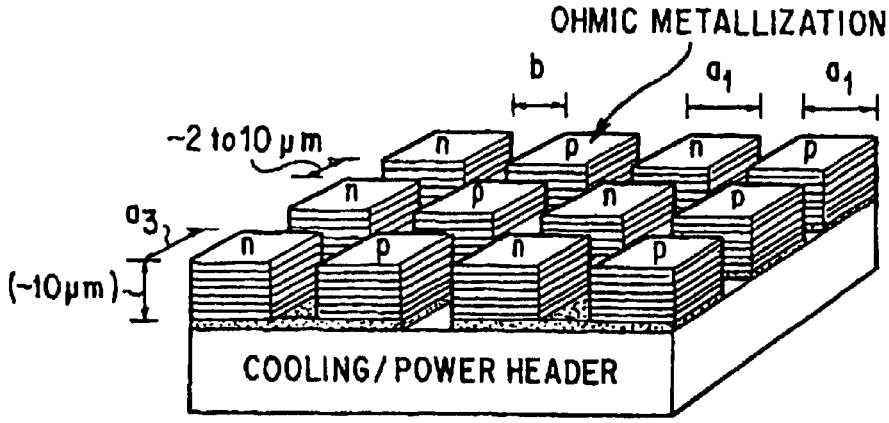
FIG. 7 is a diagram of a n and p sections of FIG. 6 after metallization and illustrating a step of manufacturing according to the invention.

Low resistivity contact metallization is then evaporated on upper surface of the n- and p-type sections, as shown in FIG. 7. In this step, either the same metallization can be used for both of the n- and p-type section, or different metallizations can be used (separate evaporations), depending on the contact resistivity requirements.

Figure 8:
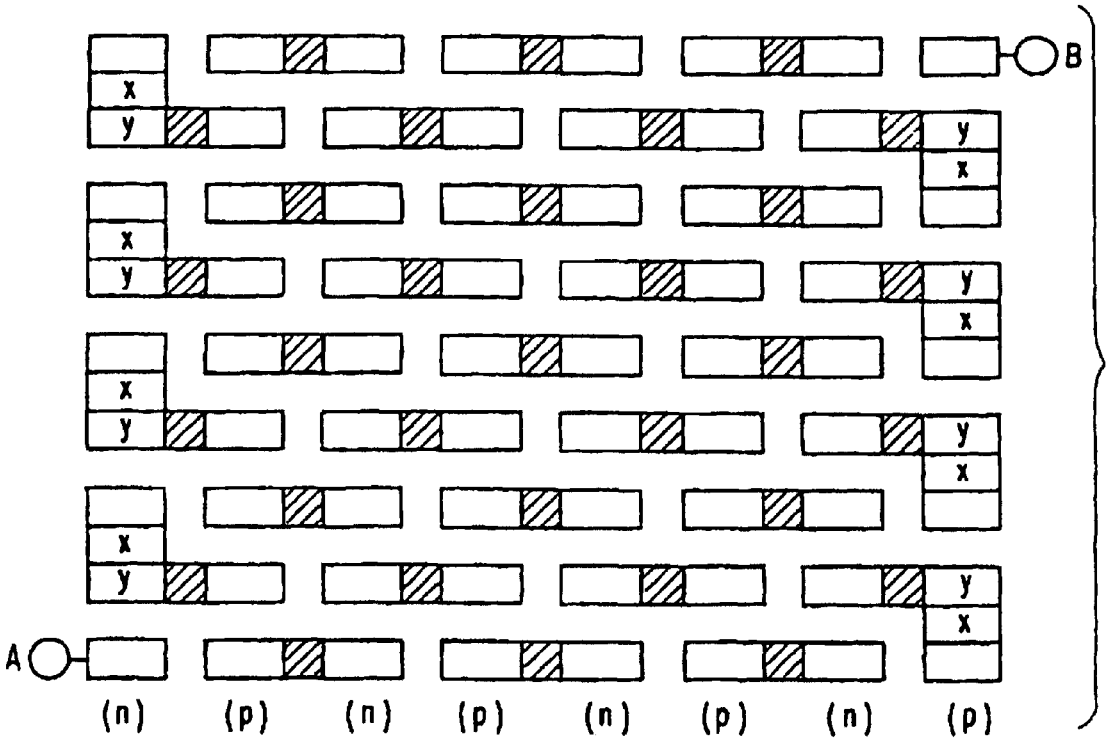
FIG. 8 is a plan view of a header for attachment to the n and p sections.

A top, pre-patterned metallization header 90 is then attached to the metallized sections. Shown in FIG. 8 is a schematic of the metallization pattern of the metallized header that will serve on the heat-sink side. An 8×9 thermoelement matrix metallization pattern is needed for this header, to correspond the metallization pattern of header 30 (see FIG. 4). The metal members of the metallization pattern provide a low-resistance contact to the sections 60 and 61.

The two leads, A and B are shown. A positive voltage would be applied to lead A and a negative (or ground) voltage would be applied to lead B for cooling. The metallization pattern pads contacting ntype and ptype elements are shown by parentheses. The spacing of the patterns matches that of the sections.

Electrical shorts between pads are indicated by an "x" in the metallized header/heat-sink. These shorts serve to keep the current flow from the top of the n-type element to the bottom of the n-type element, and similarly from the bottom of the p-type element to the top of the prsype element. In a cooling device the top is defined as being located on the heat-sink side and the bottom is defined as being on the source side. Such an arrangement will also keep the alternating n- and p-type elements in series electrically. Thus, according to the invention all of the thermoelements are thermally in parallel (between heat-sink and heat-source) and electrically in series.

For this 8×9 matrix of thermoelements, four each of the n- and p-type elements (identified by "y") do not participate in the current transport through the thickness of the film They only serve to provide the electrical connection and uniform mechanical strength in the arrange men t of the thermoelements.

In the case of an "m×n" matrix of thermoelements (m is horizontal and n is vertical) and n is odd, with n- and p-type elements alternating along the m direction, we can see that the utilization efficiency is:

$$\frac{m \times n - (n-1)}{m \times n}$$

Figure 9:
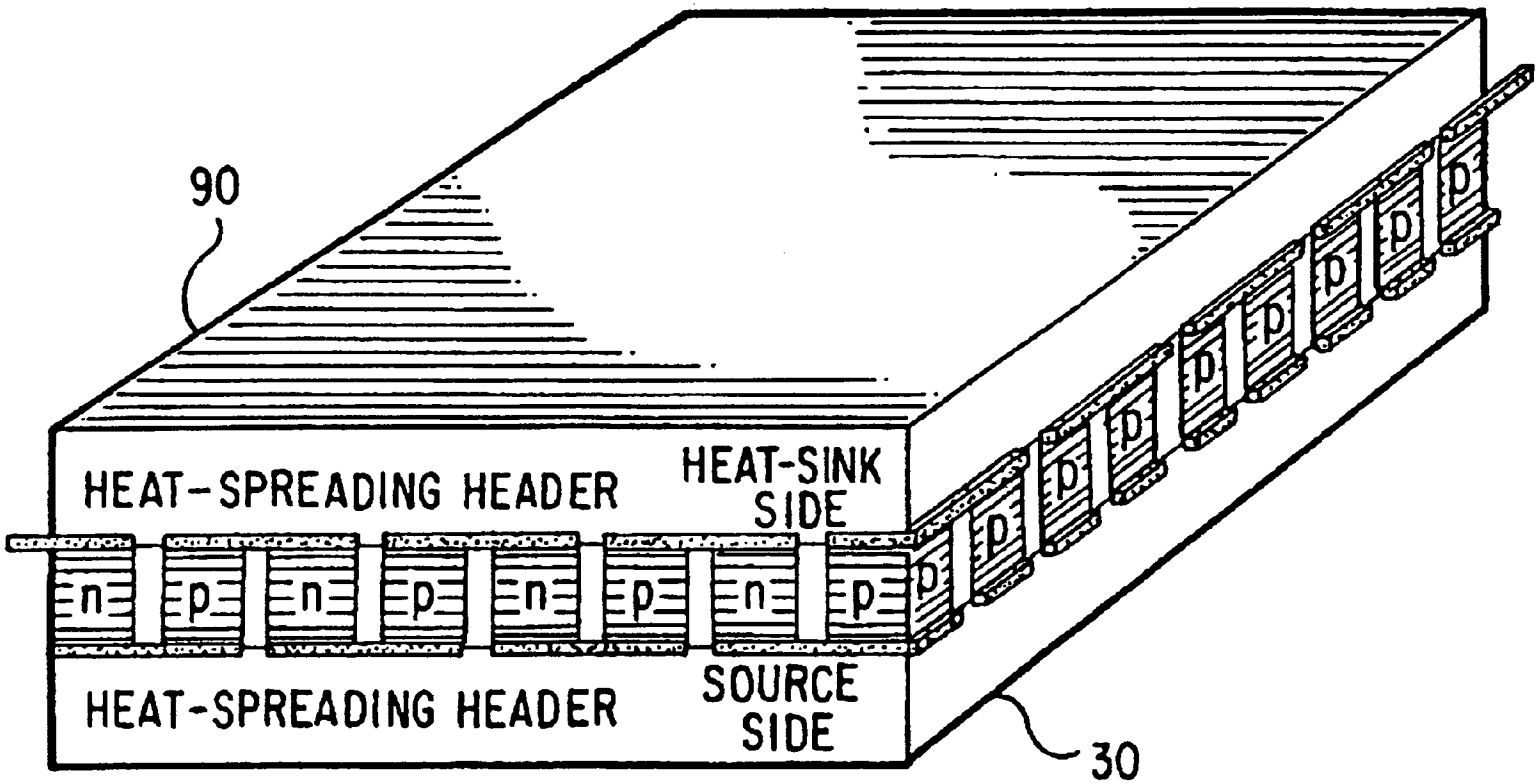
FIG. 9 is a diagram of the device according to the invention having n and p elements with the headers of FIGS. 4 and 8 attached.

This efficiency will nearly approach unity when n is large and m is large. For example, in the 8×9 matrix, –89% utilization of material is obtained. For a 25×23 element matrix, >96% utilization of material is achieved. Assuming ideal heat-spreading on the heat-sink side header and the source-side header, the heat spreading in the "non-useful" elements would be about the same as the "useful" elements. Thus, we can expect module efficiency≅(intrinsic couple efficiency× material utilization efficiency) discussed above. By choosing m>>n (if system constraints permit) a non-square geometry will minimize the difference between module and intrinsic couple efficiency. This, of course, assumes ideal heat spreading between the thermoelement and the headers. A completed device according to the invention, having a set of headers 30 and 90 (with the good head spreading characteristics) and n- and p-type elements interconnected employing an 8×9 matrix, is shown in FIG. 9.

While the sections 60 and 61 disclosed as being approximately square, the aspect ratios of the sections can be adjusted. For example, the aspect ratios can be selected to provide a desired geometry while satisfying the above m>>n condition. Also, the aspect ratios can be selected to insure low-current operation, allowing the use of low-cost power supplies for connection to the headers 30 and 90.

The material (superlattice or non-superlattice) for the n- and p-type elements can be different, as is usually the case in many conventional bulk materials. However, if the materials are the same for n- and p-type elements, and if one polarity can be typed-converted to another (p to n or n to p) by a technique, for example impurity-diffusion, without disordering the superlattice or introducing other detrimental effects, then a Bipolar Diffused, Series Interconnected, Thin-Film Thermoelectric Device (BDSIC-TFTD) can be constructed which does not require the assembly step shown in FIG. 3 (*i.e. by direct deposition*). The type-conversion can be performed at a convenient stage in the manufacturing process, such as when the device has the structure shown in FIGS. 5 and 6. Such a device can potentially be manufactured even more cost-effectively, with additional advantages and flexibility in the design of the device parameters.

The backside of an integrated circuit chip may be used as the cooling or power header. The backside, especially if it is electrically conducting, needs to be suitably modified to confine the electrical current to the thermoelectric element. One example of suitable preparation is p-n junction isolation in the backside of the chip whereby the current is made to flow through the intended thermoelectric electric elements, i.e. is confined to the elements, and is not shunted by the conducting backside of the chip. Other modifications of the backside are possible to achieve similar confinement of the current.

The backside of the chip should be of good thermal conductivity. The backside then may be used to extract heat which could be used for other purposes such as power generation. For example, the power generated using the heat could be used provide power to other circuits or to other cooling devices.

The BASIC-TFTD according to the invention is scalable to a variety of heat loads and is manufacturable in large volume (area). It is amenable to automation, is compatible with cascading or multi-staging (leading to a smaller ΔT per stage for a higher coefficient of performance in a refrigerator or for higher efficiency in a power generator) and is equally applicable to both cooling and power generation.

Obviously, numerous modifications and variations os the present invention are possible in light of the above teachings. It is therefore to be understood that, within the scope of the appended claims, the invention may be practiced otherwise than as specifically described herein.

What is claimed is:

1. A thermoelectric device, comprising:

at least one deposited film of a thermoelectric material having opposed first and second major surfaces separated by a thickness of the at least one deposited film, said deposited film being patterned to define a plurality of thermoelements;

a first header having formed thereon a first interconnecting member, said first header mounted on the first major surface of the deposited film such that the first interconnecting member is connected to one side of said plurality of thermoelements and connects adjacent thermoelements of an opposite conductivity type; and a second header having formed thereon a second interconnecting member, said second header mounted on the second major surface of the deposited film such that the second interconnecting member is connected to an opposite side of said plurality of thermoelements and connects adjacent thermoelements of an opposite conductivity type.

2. A device as recited in claim 1, comprising:

said thermoelements being arranged in a matrix pattern having rows of alternating conductivity type.

3. A device as recited in claim 2, wherein said first and second interconnecting members are connected to opposite sides of said thermoelements so that current flow through said thermoelements flows from a top to a bottom of a first thermoelement and from a bottom to a top of a second adjacent thermoelement of a opposite conductivity type from the first thermoelement.

4. A device as recited in claim 2, comprising:

said matrix pattern being m by n in size, where n is odd and m>>n.

5. A device as recited in claim 1, wherein said thermoelements are formed of a material selected from the group consisting of superlattice thermoelectric materials, quantum well structured materials and quantum dot structured materials.

6. A device as recited in claim 1, wherein said at least one deposited film of thermoelectric material comprises plural film layers deposited one on top of the other to define interfaces between each film layer.

7. A device as recited in claim 1, wherein said at least one deposited film of thermoelectric material comprises a material selected from the group consisting of superlattice materials, non-superlattice materials, quantum-well structured materials, quantum-dot structured materials and non-quantum-confined materials.

8. A device as recited in claim 7, wherein the thermoelements have a thickness of 1 to 10 microns.

9. A device as recited in claim 7, wherein the matrix pattern comprises a set of first and second thermoelements arranged in a matrix pattern with said first thermoelement having a length L1 and a width W1 and said second thermoelement having a length L2 and a width W2, with a separation distance C in a row direction and a separation distance D in a column direction such that C and D are less than L1, L2, and W1, W2.

10. A device as recited in claim 9, wherein:

L1 is in a range of 1 mm to 5 mm,

L2 is in a range of 1 mm to 5 mm,

W1 is in a range of 5 to 50 μm, and

W2 is in a range of 5 to 50 μm.

11. A device as recited in claim 10, wherein:

D is approximately 10 μm, and

C is in a range of ~2 to 10 μm.

12. A method of manufacturing a thermoelectric device, comprising:

depositing on a first substrate at least one thermoelectric film of a first conductivity type having first opposed surfaces separated by a thickness of the at least one thermoelectric film of a first conductivity type;

depositing on a second substrate at least one thermoelectric film of a second conductivity type having second opposed surfaces separated by a thickness of the at least one thermoelectric film of a second conductivity type;

dividing the first substrate to form a first plurality of thermoelectric segments of the first conductivity type;

dividing the second substrate to form a second plurality of thermoelectric segments of the second conductivity type;

arranging said first and second opposed surfaces of said first and second plurality of thermoelectric segments on a first header in an alternating pattern of said first and second thermoelectric segments separated by a predetermined distance and using the first header to connect adjacent of said first and second thermoelectric segments;

removing the first and second substrates;

patterning said first and second plurality of thermoelectric segments to form a plurality of first and second thermoelements, respectively, said first and second thermoelements having first major surfaces interconnected via the first header and second major surfaces; and mounting a second header on the second major surface of the thermoelements and using the second header to connect at least one of said first thermolements to at least one of said second thermoelements.

13. A method as recited in claim 12, wherein the steps of depositing comprise:

depositing the at least one thermoelectric film of a first conductivity type and the at least one thermoelectric film of a second conductivity type with a thickness no more than approximately 10 microns on respective first and second substrates.

14. A method as recited in claim 12, wherein said first and second headers each have a plurality of conductive members arranged in a matrix pattern, said method comprising:

disposing one of the said first thermoelements and an adjacent one of said second thermoelements on one of said conductive members of said first header to form a plurality of thermoelement pairs;

forming a conductive material on an upper surface of each of said first and second thermoelements; and disposing said conductive members of said second header on said conductive material on said first and second thermoelements to connect said pairs of thermoelements in series.

15. A method as recited in claim 14, comprising:

connecting said first header to a heat source; and applying voltages to members of said first and second headers so that a current flows from a top to a bottom of said first thermoelement of a pair and from a bottom to a top of said second thermoelement of said pair.

16. A method as recited in claim 12, wherein forming said first and second elements comprises:

disposing a film on said first header;

patterning said film to form sections; and selectively doping said sections.

17. A method as recited in claim 12, comprising:

forming said segments using a film having a thickness of no more than approximately 10 microns from a material selected from the group consisting of superlattice materials, quantum well structured materials and quantum dot structured materials.

18. A method as recited in claim 12, comprising:

patterning said segments to form said first and second elements in a matrix pattern with said first thermoelements having a width W1 and a length L1 and said second elements having a width W2 and a length L2;

separating said first and second thermoelements by a first distance C in a row direction and a second distance D in a column direction such that C, D are less than L1, L2, W1, W2.

19. A method as recited in claim 12, wherein arranging first and second plurality of segments on a first header comprises;

using as a first header a backside of an integrated circuit chip.

20. A method as recited in claim 19, wherein the thermoelectric device is configured to extract heat from said chip for power generation.

21. A method as recited in claim 16, wherein forming said first and second thermoelements comprises:

using a first header comprising a backside of an integrated circuit chip.

22. A method as recited in claim 16, wherein forming said first and second thermoelements comprises:

using a first header comprising a backside of an integrated circuit chip; and extracting heat from said chip for power generation.

23. A method as recited in claim 18, wherein the steps of patterning and separating utilize:

L1 in a range of 1 mm to 5 mm,

L2 in a range of 1 mm to 5 mm,

W1 in a range of 5 to 50 μm, and

W2 in a range of 5 to 50 μm.

24. A method as recited in claim 23, wherein the steps of patterning and separating utilize:

D approximately 10 μm, and

C in a range of ~2 to 10 μm.

25. A method of manufacturing a thermoelectric device, comprising:

disposing a first conductivity type film on a first header with the first conductivity type film including at least one deposited film of a thermoelectric material having opposed first and second major surfaces separated by a thickness of the at least one deposited film and one of the first and second major surfaces contacting the header;

patterning said film to form sections;

selectively converting the first conductivity type of selected ones of the patterned sections to a second conductivity type to define first thermoelements of the first conductivity type and second thermoelements of the second conductivity type; and connecting electrically first thermoelements having a first conductivity type to adjacent thermoelements having said second conductivity type.

26. A method as recited in claim 25, wherein selectively converting comprises one of diffusion and ion implantation.

27. A method as recited in claim 25, further comprising:

disposing on connected said firs thermoelements and said adjacent thermoelements a second header comprising a backside of an integrate circuit chip.

28. A method as recited in claim 25, wherein the thermoelectric device is configured to extract heat from said chip for power generation.

29. A method as recited in claim 25, wherein the step of disposing a first conductivity type film on a first header comprises:

utilizing as the first header a head metallized to electrically connect adjacent thermoelements of opposite conductivity type.

*30. An electronic device comprising:*

*a chip;*

*a thermoelectric device comprising plural series connected thermoelements disposed in contact with the chip; and*

*said thermoelements comprising a deposited high ZT thermoelectric film having opposed first and second major surfaces separated by a thickness of the deposited thermoelectric film, one of said opposed first and second major surfaces being in contact with said chip.*

*31. The electronic device of claim 30, wherein the chip comprises an integrated circuit chip.*

*32. The electronic device of claim 31, wherein the thermoelectric device is disposed in contact with the backside of the integrated circuit chip.*

*33. The electronic device of claim 32, wherein said backside is configured to isolate current flow between each of plural series connected thermoelements to the backside of the integrated circuit chip.*

*34. The electronic device of claim 33, wherein said backside comprises p-n junctions configured to isolate said current flow.*

*35. The electronic device of claim 30, wherein the plural series connected thermoelements comprise opposite conductivity type sub-elements arranged in a matrix pattern.*

*36. The electronic device of claim 35, wherein said matrix pattern comprises alternating rows of said opposite conductivity type sub-elements.*

*37. The electronic device of claim 35, wherein said matrix pattern comprises a first set of said sub-elements and a second set of said sub-elements, said sub-elements of said first set having a length L1 and a width W1 and said sub-elements of said second set having a length L2 and a width W2, with a separation distance C in a row direction and a separation distance D in a column direction such that C and D are less than L1, l2, and W1, W2.*

*38. The electronic device of claim 37, wherein L1 is in a range of 1 mm to 5 mm, L2 is in a range of 1 mm to 5 mm, W1 is in a range of 5 to 50 μm, and W2 is in a range of 5 to 50 μm.*

*39. The electronic device of claim 38, wherein D is approximately 10 μm, and C is in a range of ~2 to 10 μm.*

*40. The electronic device of claim 30, wherein the chip comprises:*

*a first interconnecting member connected to one side of said thermoelements and connecting adjacent thermoelements of an opposite conductivity type.*

*41. The electronic device of claim 40, wherein the thermoelectric device comprises:*

*a header having formed thereon a second interconnecting member, said second header mounted to the second major surface of the deposited thermoelectric film such that the second interconnecting member is connected to an opposite side of said thermoelements and connects said adjacent thermoelements of an opposite conductivity type.*

*42. The electronic device of claim 30, wherein the deposited high ZT thermoelectric film has a range of thickness from 5 to 20 μm.*

*43. The electronic device of claim 30, wherein the deposited high ZT thermoelectric film comprises at least one of a superlattice material, a quantum well material, and a quantum-dot material.*

*44. A thermoelectric system comprising:*

*a header; and*

*a patterned thermoelectric material deposited directly on the header.*

*45. The thermoelectric system of claim 44, further comprising:*

*an integrated circuit chip thermally coupled to the thermoelectric material through the header.*

*46. The thermoelectric system of claim 44, wherein the patterned thermoelectric material comprises:*

*a deposited thermoelectric film having opposed first and second major surfaces separated by a thickness of the deposited thermoelectric film, one of said opposed first and second major surfaces being in contact with said header.*

*47. The thermoelectric system of claim 44, wherein the patterned thermoelectric material comprises opposite conductivity type thermoelements arranged in a matrix pattern.*

*48. The thermoelectric system of claim 47, wherein said matrix pattern comprises alternating rows of said opposite conductivity type thermoelements.*

*49. The thermoelectric system of claim 48, wherein said header comprises interconnecting members configured to connect said alternating rows of said opposite conductivity type thermoelements.*

*50. The thermoelectric system of claim 47, wherein said matrix pattern comprises a first set of said thermoelements and a second set of said thermoelements, said thermoelements of said first set having a length L1 and a width W1 and said thermoelements of said second set having a length L2 and a width W2, with a separation distance C in a row direction and a separating distance D in a column direction such that C and D are less than L1, L2, and W1, W2.*

*51. The thermoelectric system of claim 50, wherein L1 is in a range of 1 mm to 5 mm, L2 is in a range of 1 mm to 5 mm, W1 is in a range of 5 to 50 μm, and W2 is in a range of 5 to 50 μm.*

*52. The thermoelectric system of claim 51, wherein D is approximately 10 μm, and C is in a range of ~2 to 10 μm.*

*53. The thermoelectric system of claim 44, wherein the patterned thermoelectric material is a high ZT thermoelectric film.*

*54. The thermoelectric system of claim 53, wherein the hight ZT thermoelectric film comprises at least one of a*

*superlattice material, a quantum well material, and a quantum-dot material.*

*55. The thermoelectric system of claim 53, wherein the high ZT thermoelectric film has a range of thickness from 5 to 20 μm.*

*56. An electronic device according to claim 30 wherein the chip includes first interconnection members connected to the first major surfaces of the thermoelements such that the first interconnecting members connect adjacent thermoelements of opposite conductivity types, the electronic device further comprising:*

*a header including thereon second interconnecting members, said header mounted on the second major surfaces of the thermoelements such that the thermoelements are between the chip and the header and such that the second interconnection members connect adjacent thermoelements of opposite conductivity types.*

* * * * *

UNITED STATES PATENT AND TRADEMARK OFFICE

CERTIFICATE OF CORRECTION

PATENT NO. : RE41,801 E
APPLICATION NO. : 10/404144
DATED : October 5, 2010
INVENTOR(S) : Venkatasubramanian It is certified that error appears in the above-identified patent and that said Letters Patent is hereby corrected as shown below:

Column 1, Line 10: Please correct "Mar. 31, 1997. +gi" to read -- Mar. 31, 1997. --

Column 3, Line 61: Please correct "10 ~m" to read --10 μm --

Column 4, Example 1, Line 26: Please correct "Area = $a_1 \times a_3 = 0.0005\ cm_2$"
to read -- Area $\cong a_1 \times a_3 \cong 0.0005\ cm_2$ --
Line 27: Please correct "50 mm" to read -- 50 μm --

Example 2, Line 28: Please correct "Area = $a_1 \times a_3 = 0.0005\ cm_2$"
to read -- Area $\cong a_1 \times a_3 \cong 0.0005\ cm_2$ --
Line 29: Please correct "100 mm" to read -- 100 μm --

Column 5, Line 18: Please correct "–89%" to read -- ~89% --

<u>In the Claims:</u>
Column 9, Claim 27, Line 18: Please correct "said firs" to read -- said first --
Line 20: Please correct "integrate" to read -- integrated --
Claim 37, Line 63: Please correct "l2" to read -- L2 --

Column 10, Claim 54, Line 67: Please correct "hight" to read -- high --

Signed and Sealed this
Twenty-second Day of March, 2011

David J. Kappos

David J. Kappos
*Director of the United States Patent and Trademark Office*